United States Patent [19]

Bickford et al.

[11] Patent Number: 4,832,255
[45] Date of Patent: May 23, 1989

[54] PRECISION SOLDER TRANSFER METHOD AND MEANS

[75] Inventors: Harry R. Bickford, Ossining; Kurt R. Grebe, Beacon, both of N.Y.; Caroline A. Kovac, Ridgefield, Conn.; Michael J. Palmer, Walden, N.Y.

[73] Assignee: International Business Machines Corporation, Armonk, N.Y.

[21] Appl. No.: 223,818

[22] Filed: Jul. 25, 1988

[51] Int. Cl.$^4$ .................. B23K 3/00; H01L 21/58
[52] U.S. Cl. .................... 228/254; 228/179; 228/41; 228/51; 228/56.3; 29/874; 29/877; 29/879
[58] Field of Search ............. 228/56.3, 179, 180.2, 228/253, 254, 41; 269/903; 29/874, 877, 879; 118/401

[56] References Cited

U.S. PATENT DOCUMENTS

| | | |
|---|---|---|
| 2,984,893 | 5/1961 | Spooner ......................... 29/877 |
| 3,320,658 | 5/1967 | Bolda et al. ..................... 29/879 |
| 3,472,365 | 10/1969 | Tiedema . |
| 3,978,569 | 9/1976 | Cobaugh et al. . |
| 4,209,893 | 7/1980 | Dyce et al. . |
| 4,354,629 | 10/1982 | Grassauer et al. . |
| 4,484,704 | 11/1984 | Grassauer et al. . |

FOREIGN PATENT DOCUMENTS

| | | |
|---|---|---|
| 3608101 | 9/1987 | Fed. Rep. of Germany ..... 228/56.3 |
| 138371 | 10/1979 | Japan .................................. 228/254 |
| 86679 | 6/1980 | Japan ................................ 228/56.3 |

Primary Examiner—Nicholas P. Godici
Assistant Examiner—Samuel M. Heinrich
Attorney, Agent, or Firm—Perman & Green

[57] ABSTRACT

This invention employs a carrier upon which a thin conductive film has been applied. The conductive film is of a metallic material which exhibits a surface energy such that it is not readily wetted by solder. A patterned mask is disposed on the conductive film, with the mask having openings which expose selected areas of the conductive film. Solder is deposited in the mask openings and is weakly adherent to the exposed areas of the conductive film. The carrier is then disposed over and in registration with conductive land areas of a circuit carrier, such that the solder in the mask openings is aligned with the land areas of the circuit carrier. Subsequently, the carrier and circuit land areas are brought into contact, heated, the solder bonded to the lands, and the carrier is lifted away for subsequent reuse.

In another species of the invention, a thin film layer of solder is directly deposited on and weakly adherent to a flexible base layer. Subsequently, tool means which registers with the areas to be soldered, presses the base layer/solder combination against the areas to be coated with solder, thereby causing the solder to adhere to the underlying circuit configuration.

9 Claims, 2 Drawing Sheets

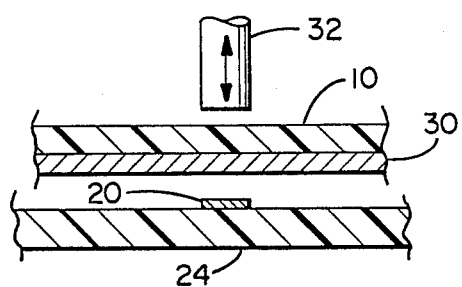
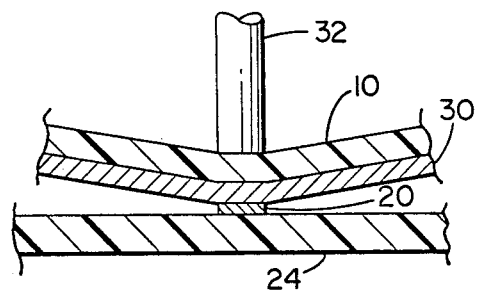
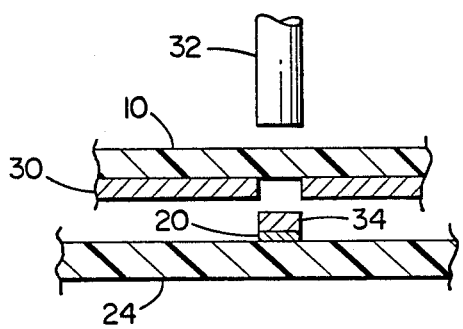
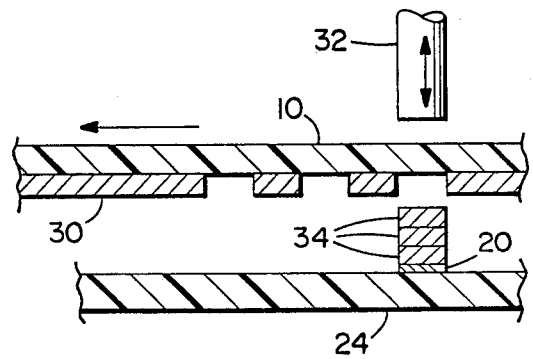
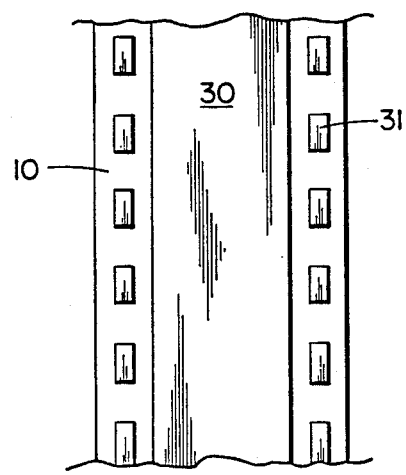

PRECISION SOLDER TRANSFER METHOD AND MEANS

FIELD OF THE INVENTION

This invention relates to soldering apparatus and more particularly to means for delivering precisely metered amounts of solder to microminiature circuit configurations.

BACKGROUND OF THE INVENTION

It is particularly difficult to apply solder coatings with consistent thicknesses and configurations to circuit boards having conductive lands with close edge-to-edge spacings (e.g. 20 mils or less). Solder screening is not satisfactory as non-uniform amounts of solder often remain after the screen is removed. When solder is reflowed to attach a chip to the lands, a "solder bridge" can occur between adjacent lands causing a potentially catastrophic failure. It has been found increasingly difficult to use a screening process where solder having a thickness of less than 0.002 inches is either desirable or required. These thicknesses are employed for attaching tape automated bonding (TAB) packages to circuit boards and insure that no solder bridging occurs.

TAB packaging is seeing ever wider usage as it can be handled in an automated fashion and is one of the least expensive packaging configurations. It is important therefore, that even with the stringent dimensional requirements placed upon the soldering systems by TAB packages, that the cost of solder application be minimized.

The prior art has attempted to solve the precision solder application problem via a number of routes. U.S. Pat. No. 4,209,893 to Dyce et al provides a solder carrier strip wherein the strip is punched and solder preforms are pressed into the punched areas. This technique, while usable for relatively large circuit configurations, is not usable for the miniature TAB packages for the reason that mechanical punching is too imprecise.

U.S. Pat. Nos. 4,354,629 and 4,484,704 to Grassauer et al both describe a system for joining flat or ribbon cables to connectors. Those patents teach the use of a pair of polymeric webs with a continuous solder preform packaged therebetween. One of the webs has a series of windows disposed in it. The windows are registered over conductors to be soldered, with pressure and heat being applied to cause solder reflow. The partitions between adjacent windows prevent solder bridging. Here again, this technique is suitable for relatively large size conductor/circuit board arrangements; however it is not appropriate for microminiature circuit configurations. For instance, the continuous layer of solder underneath the window divisions would tend, upon melting, to create solder bridging if closely spaced lands were being tinned.

Accordingly, it is an object of this invention to provide a precision solder transfer method particularly suitable to microminiature package configurations.

It is another object of this invention to provide a precision solder transfer technique which is adapted to employ manufacturing techniques commonly employed for circuit boards and semiconductor devices.

SUMMARY OF THE INVENTION

The present invention employs a carrier upon which a thin conductive film has been applied. The conductive film is of a metallic material which exhibits a surface energy such that it is not readily wetted by solder. A patterned mask is disposed on the conductive film with the mask having openings which expose selected areas of the conductive film. Solder is deposited in the mask openings and is weakly adherent to the exposed areas of the conductive film. The carrier is then disposed over and in registration with conductive land areas of a circuit carrier, such that the solder in the mask openings is aligned with the land areas of the circuit carrier. Subsequently, the carrier and circuit land areas are brought into contact; heated; the solder bonded to the lands; and the carrier is lifted away for subsequent reuse.

In another species of the invention, a thin film layer of solder is directly deposited on and weakly adherent to a flexible base layer. The solder film can either be continuous or be deposited, through a mask, in discrete areas which will register with circuit areas to which solder is to be applied. Subsequently, tool means which registers with the areas to be soldered, presses the base layer/solder combination against the areas to be coated with solder, thereby causing the solder to adhere to the underlying circuit configuration. When the tool means retracts, in the case of the continuous film of solder, the flexible base layer returns to its non stressed position and causes a rupture between the solder adhering to the circuit configuration and the remaining solder on the flexible base layer.

BRIEF DESCRIPTION OF THE DRAWINGS

FIGS. 6–8 show a method for application of solder to a conductive land area which avoids the need for a mask.

FIG. 9 shows the application of multiple layers of solder on a single conductive land area.

FIG. 10 is a plan view of the web solder carrier showing sprocket holes which enable it to be indexed from position to position.

DETAILED DESCRIPTION OF THE INVENTION

Figure 1:
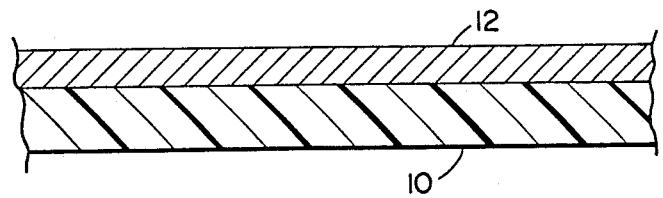
FIG. 1 is a sectional view of the base layer after a conductive film has been placed thereon.

FIG. 1 depicts a first embodiment of the solder delivery system of this invention. In one embodiment substrate 10 is a polymeric carrier or tape, preferably comprised of a polyimide which will withstand the operating temperatures encountered with this invention. Preferably, carrier 10 is similar to a 35 millimeter film strip with sprocket holes which enable its forward and/or backward movement under precise control of a sprocket. Carrier 10 is metallized with a thin layer 12 of a metal which will not be wetted by a molten tin/lead solder. In specific, conductive film 12 should exhibit a surface energy such that it cannot experience a strong surface bonding interaction with a solder deposit but should sustain a weak mechanical bond with solder deposited thereon. Metals such as niobium, aluminum and chromium all exhibit this particular requirement.

In a preferred embodiment of the invention, both carrier 10 and metallization layer 12 are sufficiently transparent that registration features on an underlying circuit board can be recognized therethrough. A very thin layer of niobium (e.g. on the order of 500 Angstroms thickness) will satisfy this requirement. A preferred method for deposition of the niobium is via sputtering such that a relatively constant thickness film can be produced which is adherent to underlying tape 10.

Figure 2:
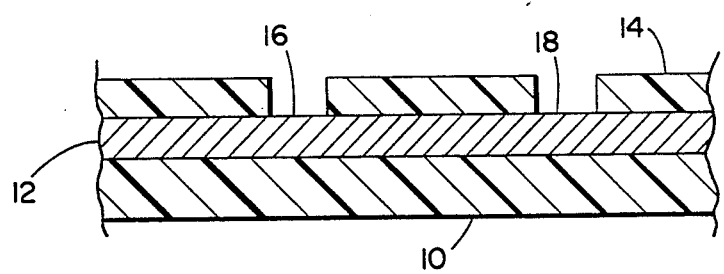
FIG. 2 is a showing of the structure of FIG. 1 after a patterned mask has been placed thereon.

Referring to FIG. 2, mask 14 has been emplaced over conductive film 12 leaving areas 16 and 18 thereof exposed. Mask 14 allows solder to be selectively deposited onto areas 16 and 18 while preventing its deposition elsewhere. Mask 14 may be either permanent or non-permanent. If it is non-permanent, it may comprise a dry film photo resist which is removed prior to solder transfer. A permanent solder mask is preferred, however, as it is re-useable and less costly in terms of processing steps. The solder mask must be able to withstand solder reflow temperatures (e.g. 350° C.) and provide the necessary lithographic tolerances and stability.

A preferred mask is a polyimide which is built up to the thickness of the desired solder layer. The mask may be patterned by a variety of known techniques. For instance, the polyimide layer may be deposited, cured and then etched using a normal photoresist mask to clear away the portions where solder is desired to be deposited. Alternatively, a photoresist may be directly placed onto conductive film 12, areas opened to expose the areas of conductive film 12 where solder is not desired and subsequently, a polyimide electrophoretically deposited onto the exposed conductive areas.

Figure 3:
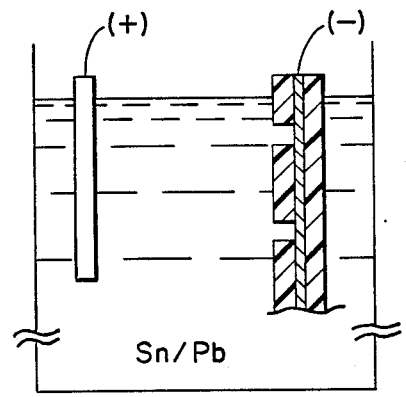
FIG. 3 is a side view of an electroplating bath for deposition of solder in the mask openings.

As schematically shown in FIG. 3, the assembly of FIG. 2 is placed in an electroplating bath which contains a proper ratio of tin and lead ions such that when electroplating is started, proper proportions of ions are deposited onto the exposed areas of conductive film 12. Preferred plating thicknesses are in the range of 0.0005 to 0.0025 inches (0.127 mm to 0.635 mm) of solder in exposed areas 16 and 18.

Figure 4:
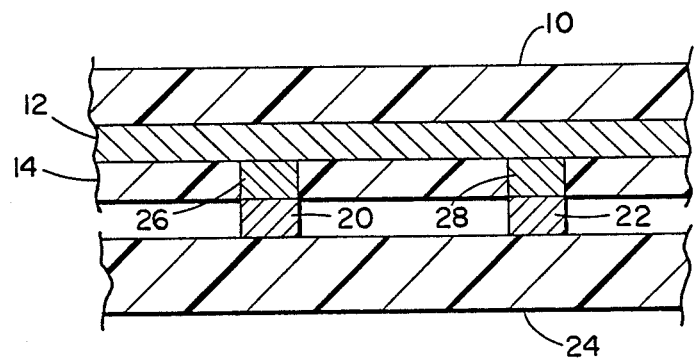
FIG. 4 is side sectional view of the solder transfer web of this invention in registration over a circuit carrier.

In FIG. 4, the solder transfer film has been turned over and aligned with fluxed copper leads 20 and 22 on circuit board 24. The alignment of the solder transfer film and the circuit board is straight-forward as the transfer film is transparent and may be aligned automatically with registration features on the underlying circuit board. The transparency feature is useful in the initial setup and adjustment of the mechanisms which controls the relative orientation between the transfer film and the underlying circuit board. Thus, assuming that a sprocketed film is being employed, adjustments can be made to the placement of the circuit board with respect the film and the registration visually checked through the film.

Figure 5:
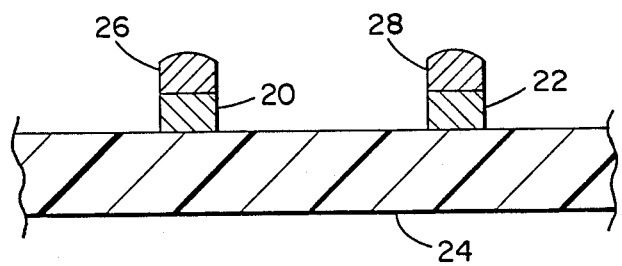
FIG. 5 is a side sectional view of the circuit carrier after removal of the solder transfer web.

Once the solder transfer film is in place over circuit board 24, the assembly is placed in a reflow unit wherein solder inserts 26 and 28 are brought to the melting point and are caused to adhere to conductive land 20 and 22. As aforestated, since conductive film 12 is not wettable by solder, no residue is left thereon and the film may be reused. The final circuit assembly, after removal of the solder transfer film is shown in FIG. 5.

The solder transfer film may then be replated and used again. The film can be stored and does not require expensive screening equipment. Furthermore, by varying the thickness of polyimide mask layer 14 and controlling the solder plating process, the precise amount of solder to be put in place can be well controlled.

Turning now to FIG. 6, another embodiment of the invention is shown. Here tape 10 is continuous in nature and has a thin, non-wettable metallic coating thereon which has a layer of solder 30 weakly adherent thereto. Tape 10 may be provided with sprocket holes 31 as shown in FIG. 10, much the same as a 35 millimeter film strip. A circuit board 24 with a circuit land 20 is disposed beneath tape 10. A tool 32 is adapted for reciprocating movement and is caused, when in its lower-most extension (FIG. 7), to cause tape 10 to be deformed and to press solder layer 30 against land 20. Tool 32 is heated, therefore the applied pressure and heat causes a bond to be created between land 20 and the portion of solder layer 30 which is contact therewith. When tool 32 is withdrawn, tape 10 returns to its non flexed position and in so doing, causes ruptures to occur between solder layer 30 and the portion 34 of solder which is adherent to land 20.

The time of application of tool 32 to tape 10 and its temperature is adjusted so that solder portion 34 does not actually melt but rather strongly bonds to conductor 20 such that when tool 32 is withdrawn, it remains in place rather than traveling back with tape 10 as tape 10 returns to its non stressed position.

The thickness of solder layer 30 should be quite thin in order for this technique to be successfully employed. However, the optimum thickness of layer 30 largely depends upon the ductility characteristics of the solder and the design of the tool head. In general, a thickness in the range of 10 mils or less is preferred. Under certain circumstances, it may be desired to emplace heavy thicknesses of solder onto circuit land 20. In such case, reference is made to FIG. 9 wherein tool 32 may be reciprocated to apply multiple solder layers to land 20, as tape 10 is incremented over circuit board 24.

While tool 32 is shown as having a single head, a multi head tool can be employed which registers with a plurality of land areas on the underlying circuit board. Furthermore, a platen can be emplaced under circuit board 24 to provide the heat rather than causing tool 32 to be heated.

EXAMPLE

The process shown in FIGS. 1-5 was carried out using as a starting material, a Kapton polyimide sheet, 0.002 inches (0.508 mm) thick (Kapton is a trademark of the DuPont Corporation, Wilmington, Del.). The material is first sputtered clean in an oxygen atmosphere with a background pressure of ten microns at 500 watts rf for five minutes. It was then sputter cleaned in argon with a background pressure of the 5 microns at 500 watts rf for five minutes. It was then coated with a layer of Niobium to a thickness of 200 Angstroms, using a DC sputtering system.

A second Kapton film having a thickness of 0.001 inches (0.254 mm) was coated with an epoxy modified acrylic adhesive, also 0.001 inches (0.254 mm) thick. The second film was then mechanically punched to yield openings coincidental with lands to be coated. The two films were then hot press laminated at 130° C. for 45 minutes at 3 tons/sq. ft.

Solder plating was then done on a commercially available system using a Solderex 60/40 Sn/Pb plating bath. (Solderex is a trademark of the Sel-Rex Corporation, a division of OMI International, 75 River Road, Nutley, N.J. 07110). Current density was maintained at 21 ma/sq. cm. for 35 minutes yielding 0.002 inches (0.508 mm) of solder.

A suitable board with conductive lands coincident to the solder mask was coated with Alpha 611 RMA (rosin, mildly activated) flux (611 RMA is a trademark of Alpha Metals Inc., 600 Route 440, Jersey City, N.J. 07304).

The solder transfer film was then held by a tool having both vacuum and nozzles capable of delivering heated nitrogen. The solder transfer film was brought into contact with the board to be coated while allowing nitrogen heated to 350° C. to blow on the back of the film for 10 seconds. Vacuum was applied by the tool and the solder transfer completed.

As an alternative to the second Kapton film, a Vacrel permanent resist film having a thickness of 0.002 inches (0.508 mm) could be applied to the first Kapton sheet with Niobium already in place. (Vacrel is a trademark of the DuPont Corporation, Wilmington, Del.). The composite could then be exposed, for 10 seconds using a glass mask to coincide with lands to be soldered coated. The films are then allowed to sit for 30 minutes before being developed in a 1,1,1 trichloroethane and then dried with nitrogen. A blanket exposure for 2 minutes followed by a bake at 150° C. for 30 minutes will yield a permanent mask from the Vacrel material.

It should be understood that the foregoing description is only illustrative of the invention. Various alternatives and modifications can be devised by those skilled in the art without departing from the invention. For instance, while the polymeric carrier has been described in 35 mm film format, it could easily be configured as individual carriers having the desired pattern or as groups of individual carriers in various planar configurations.

We claim:

1. A solder transfer device comprising:
    a base layer;
    conductive film means exhibiting a surface energy such that it is not readily wetted by solder, disposed on said base layer;
    a patterned mask disposed on said conductive film means, said mask having openings which expose selected areas of said conductive film means; and
    solder disposed in said openings and weakly adherent to said exposed areas of said conductive film means.

2. The invention as defined in claim 1 further comprising:
    means for disposing and registering said solder transfer device over circuit means, such that said circuit means are in alignment with said solder pattern and;
    means for effecting transfer of said solder to said circuit means.

3. The invention as defined in claim 2 wherein said base layer and conductive film are transparent.

4. The invention as defined in claim 1 wherein said conductive film is selected from the group consisting of niobium, chromium and aluminum.

5. The invention as defined in claim 4 wherein said base layer comprises a web of polymeric material containing a plurality of said patterned masks disposed thereon.

6. In a solder transfer carrier including a polymeric base layer, a thin conductive film adherent thereto, which conductive film is non wettable by solder and a mask layer exposing a pattern of discrete areas of said conductive film, the method comprising:
    disposing said carrier in an electroplating bath solution of lead and tin in proper ratio to comprise solder; and
    applying a voltage between said conductive film and an electrode in said electroplating bath to electroplate said lead and tin onto said thin conductive film wherever said conductive film is exposed by said mask layer.

7. The method of claim 6 further comprising:
    registering said carrier over a substrate containing conductive areas, and bringing said solder pattern into contact with said conductive areas; and transferring said solder pattern from said carrier to said conductive areas.

8. The method of claim 7 wherein said transfer step includes the application of heat to effect reflow of said solder pattern onto said conductive areas.

9. A solder transfer device comprising:
    a flexible tape;
    a thin film of solder weakly adherent to said flexible tape;
    circuit means; and
    movable heated tool means for distorting said flexible tape and adherent film of solder to press it against said circuit means, the temperature of said tool means being insufficient to liquify said solder, but sufficient, when combined with pressure, to cause a discrete area of said solder beneath said tool means to adhere to said circuit means, whereby upon removal of said tool means, said flexible tape returns to its non distorted condition thereby severing said discrete area from the remainder of said thin film of solder.

* * * * *